United States Patent
Aharoni et al.

(10) Patent No.: US 8,195,728 B2
(45) Date of Patent: Jun. 5, 2012

(54) HANDLING MASK AND RANGE CONSTRAINTS

(75) Inventors: Ehud Aharoni, Kfar Saba (IL); Oded Margalit, Ramat Gan (IL)

(73) Assignee: International Business Machines Corporation, Armonk, NY (US)

( * ) Notice: Subject to any disclaimer, the term of this patent is extended or adjusted under 35 U.S.C. 154(b) by 1092 days.

(21) Appl. No.: 12/099,795

(22) Filed: Apr. 9, 2008

(65) Prior Publication Data
US 2009/0259703 A1    Oct. 15, 2009

(51) Int. Cl.
    *G06F 7/58* (2006.01)
(52) U.S. Cl. ............................................. 708/250
(58) Field of Classification Search .................. None
    See application file for complete search history.

(56) References Cited

U.S. PATENT DOCUMENTS

| | | | |
|---|---|---|---|
| 6,175,946 B1 | 1/2001 | Ly | |
| 7,028,067 B2 | 4/2006 | Abraham | |
| 7,093,205 B2 | 8/2006 | Heydler | |
| 2003/0200244 A1 | 10/2003 | Abraham | |
| 2007/0067374 A1* | 3/2007 | Iketani et al. | 708/250 |
| 2009/0259704 A1* | 10/2009 | Aharoni et al. | 708/210 |
| 2010/0082719 A1* | 4/2010 | Adir et al. | 708/250 |
| 2011/0029588 A1* | 2/2011 | Ross | 708/254 |

* cited by examiner

Primary Examiner — David H Malzahn (57) ABSTRACT

Handling mask and range constraints. For example, a method of handling range and mask constraints, may include determining whether or not to utilize a mask constraint and a range constraint by determining whether or not the range and mask constraints are satisfiable. Other embodiments are described and claimed.

17 Claims, 3 Drawing Sheets

HANDLING MASK AND RANGE CONSTRAINTS

FIELD

Some embodiments are related to the field of handling one or more range and/or mask constraints.

BACKGROUND

Generation of random or pseudo-random numbers is a fundamental building stone in many applications. For example, pseudo random generation of a number may be required in context of Pseudo Random Test Generators (PRTGs) for hardware verification. Hardware verification may involve generating pseudo random op-code instructions, and may require pseudo random generation of numbers that satisfy one or more constraints, e.g., a range constraint and/or a mask constraint. The constraints may arise, for example, from the tested hardware architecture, as well as from a user specification. The pseudo randomly generated numbers may be required to be selected, e.g., with a uniform distribution, from a set of all valid numbers that satisfy the one or more constraints.

Some computing systems, for example, computing systems including post-silicon RTGs, may require generating pseudo random numbers while consuming relatively short computing time and/or small memory space.

SUMMARY

Some embodiments include, for example, devices, systems and methods of handling mask and range constraints.

Some embodiments include, for example, a method of handling range and mask constraints. The method may include determining whether or not to utilize a mask constraint and a range constraint by determining whether or not the range and mask constraints are satisfiable.

In some embodiments, determining whether or not the range and mask constraints are satisfiable may include determining whether or not at least one number satisfies the both the range and mask constraints.

In some embodiments, determining whether or not the range and mask constraints are satisfiable may include determining a first number based on the range and mask constraints; determining a second number based on the first number and on the mask constraint; and determining whether or not the range and mask constraints are satisfiable by determining whether or not the second number satisfies the range constraint.

In some embodiments, determining the first number may include determining a highest number which is smaller than or equal to a number corresponding to a combination of an upper bound of the range and a fixed-bit component of the mask constraint, and which satisfies a variable-bit component of the mask constraint.

In some embodiments, determining the first number may include determining the first number based on a bit index of a most significant non-zero bit of a string corresponding to a subtraction of the fixed-bit component from the upper bound; and wherein a bit having the index of a string corresponding to the variable-bit component has a zero value.

In some embodiments, determining the first number may include determining a first string based on the upper bound and the mask constraint; determining a second string representing a number corresponding to an index of a most significant non-zero bit of the first string; and determining the first number based on the upper bound, the mask constraint and the second string.

In some embodiments, determining the second number may include determining the second number based on a sum of the first number and a number corresponding to a fixed-bit component of the mask constraint.

In some embodiments, the method may include utilizing the range and mask constraints as part of a random-number-generation process only if it is determined that the mask and range constraints are satisfiable.

In some embodiments, the method may include modifying at least one of the mask and range constraints if it is determined that the mask and range constraints are not satisfiable.

In some embodiments, at least one of the mask and range constraints may include an N bit string, and the method may include determining whether or not the range and mask constraints are satisfiable within a time complexity of no more than an order of log(N).

Some embodiments include a system capable of utilizing range and mask constraints, the system including a constraint checker to determine whether or not to utilize a mask constraint and a range constraint by determining whether or not the range and mask constraints are satisfiable.

In some embodiments, the constraint checker is capable of determining whether or not the range and mask constraints are satisfiable by determining whether or not at least one number satisfies the both the range and mask constraints.

In some embodiments, the constraint checker is capable of determining a first number based on the range and mask constraints; determining a second number based on the first number and on the mask constraint; and determining whether or not the range and mask constraints are satisfiable by determining whether or not the second number satisfies the range constraint.

In some embodiments, the constraint checker is capable of determining the first number by determining a highest number which is smaller than or equal to a number corresponding to a combination of an upper bound of the range and a fixed-bit component of the mask constrain, and which satisfies a variable-bit component of the mask constraint.

In some embodiments, the constraint checker is capable of determining the first number based on a bit index of a most significant non-zero bit of a string corresponding to a subtraction of the fixed-bit component from the upper bound; wherein a bit having the index of a string corresponding to the variable-bit component has a zero value.

In some embodiments, the constraint checker is capable of determining the second number based on a sum of the first number and a number corresponding to a fixed-bit component of the mask constraint.

In some embodiments, the system may include a pseudo random number generator to utilize the range and mask constraints as part of a pseudo random-number-generation process only if it is determined that the mask and range constraints are satisfiable.

Some embodiments include a computer program product including a computer-useable medium including a computer-readable program, wherein the computer-readable program when executed on a computer causes the computer to determine whether or not to utilize a mask constraint and a range constraint by determining whether or not the range and mask constraints are satisfiable.

In some embodiments, the computer-readable program when executed on the computer causes the computer to determining whether or not at least one number satisfies the both the range and mask constraints.

In some embodiments, the computer-readable program when executed on the computer causes the computer to determine a first number based on the range and mask constraints; determine a second number based on the first number and on the mask constraint; and determine whether or not the range and mask constraints are satisfiable by determining whether or not the second number satisfies the range constraint.

Some embodiments may include, for example, a computer program product including a computer-useable medium including a computer-readable program, wherein the computer-readable program when executed on a computer causes the computer to perform methods in accordance with some embodiments of the invention.

Some embodiments may provide other and/or additional benefits and/or advantages.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality" as used herein includes, for example, "multiple" or "two or more". For example, "a plurality of items" includes two or more items.

The term "random" as used herein includes, for example, random, pseudo-random, unpredictable and/or haphazard. The terms "random" and/or "pseudo-random" as used herein may relate, for example, to one or more items or numbers that lack order, that appear to lack order, that lack predictability, that appear to lack predictability, that lack a definitive pattern, that appear to lack a definitive pattern, that are haphazard or appear to be haphazard, that are generated or produced by a process whose output does not follow a describable pattern or a deterministic pattern, that do not follow a deterministic rule, that appear to not follow a deterministic rule, that appear to be chaotic or disorganized, or the like.

Although portions of the discussion herein relate, for demonstrative purposes, to wired links and/or wired communications, embodiments of the invention are not limited in this regard, and may include one or more wired or wireless links, may utilize one or more components of wireless communication, may utilize one or more methods or protocols of wireless communication, or the like. Some embodiments may utilize wired communication and/or wireless communication.

At an overview, some embodiments provide devices, systems and/or methods of checking whether or not a mask constraint and a range constraint are satisfiable; and/or determining whether or not to utilize a mask constraint and a range constraint by determining whether or not the range and mask constraints are satisfiable. For example, the predefined mask and range constraints may be satisfiable if, and only if, there exists at least one number that satisfies both the range constraint and the mask constraint. The mask and/or range constraints may be represented, for example, by N-bit strings. The range constraint ("the range") may be defined, for example, by a lower bound and an upper bound, e.g., lower bound=00000001, upper bound=11111111. A mask constraint denoted M ("the mask") constraining a number may refer to a binary representation of the number, e.g., refer to a string of N binary bits representing the number. The mask M may constrain, for example, one or more of the N bits of the number to have specific values ("the fixed bits"); and maintain one or more other bits of the number unconstrained ("the variable bits"). For example, a mask "XXX1XX0X" may constrain a second Least-Significant-Bit (LSB) and a fifth LSB of the number to have the values "0" and "1", respectively, and maintain values of a first, third, fourth, sixth, seventh and eighth LSBs of the number unconstrained.

Some embodiments may include a constraint checker capable of determining whether or not the range and mask constraints are satisfiable, for example, by applying a predefined sequence of logical operations to a plurality of strings representing the range and mask constraints, e.g., as described below.

In some embodiments, the constraint checker may determine a first number based on the mask constraint and an upper bound of the range constraint; determine a second number based on the first number and the fixed bits of the mask constraint; and determine whether or not the range and mask constraints are satisfiable by determining whether or not the second number satisfies the range constraint.

In some embodiments, the constraint checker may determine whether or not the mask and range constraints are satisfiable within a time period corresponding to a time complexity of no more than an order of log(N), and/or utilizing a constant memory space, e.g., assuming a machine having an N word-size to process a string of N binary bits as a single word.

In some embodiments, the constraint checker may be associated with, or may be implemented as part of a Pseudo Random Number Generator (PRNG), and/or a Pseudo Random Test Generator (PRTG), which may be used for simulation based verification. The PRNG and/or PRTG may be required to generate values for instruction opcodes, satisfying a plurality of user defined and/or architecture defined constraints, e.g., which may be represented by one or more range and mask constraints. Some embodiments may be applied in a context of post-silicon exercisers.

In some embodiments, the predefined mask and/or range constraints may be iteratively modified, changed, narrowed, and/or broadened, e.g., by a user and/or application if, for example, until it is determined that the predefined mask and range constraints are satisfiable.

In some embodiments, the constraint checker may a-priori check, for example, prior to and/or without utilizing range and mask constraints, whether or not to utilize the range and/or mask constraints. For example, the constraint checker may check prior to and/or without attempting to generate a pseudo random number, whether or not a pseudo random number may even be generated based on the predefined mask and range constraints. Accordingly, an attempt to generate one or more pseudo random numbers may be performed, for example, only after determining that the range and mask constraints are satisfiable; and/or the PRNG may be provided only with range and mask constraints which are determined to be satisfiable. Therefore, a relatively short time period and/or a relatively small amount of memory space may be utilized by the PRNG.

In some embodiments, the constraint checker may determine a maximal set of constrains which has a solution, and/or a minimal set of constraints, which does not have a solution, for example, by repeatedly determining whether or not each set of constraints is satisfiable, without attempting to generate a solution for the set.

In other embodiments the system element may be implemented as part of any other suitable device or system.

Figure 1:
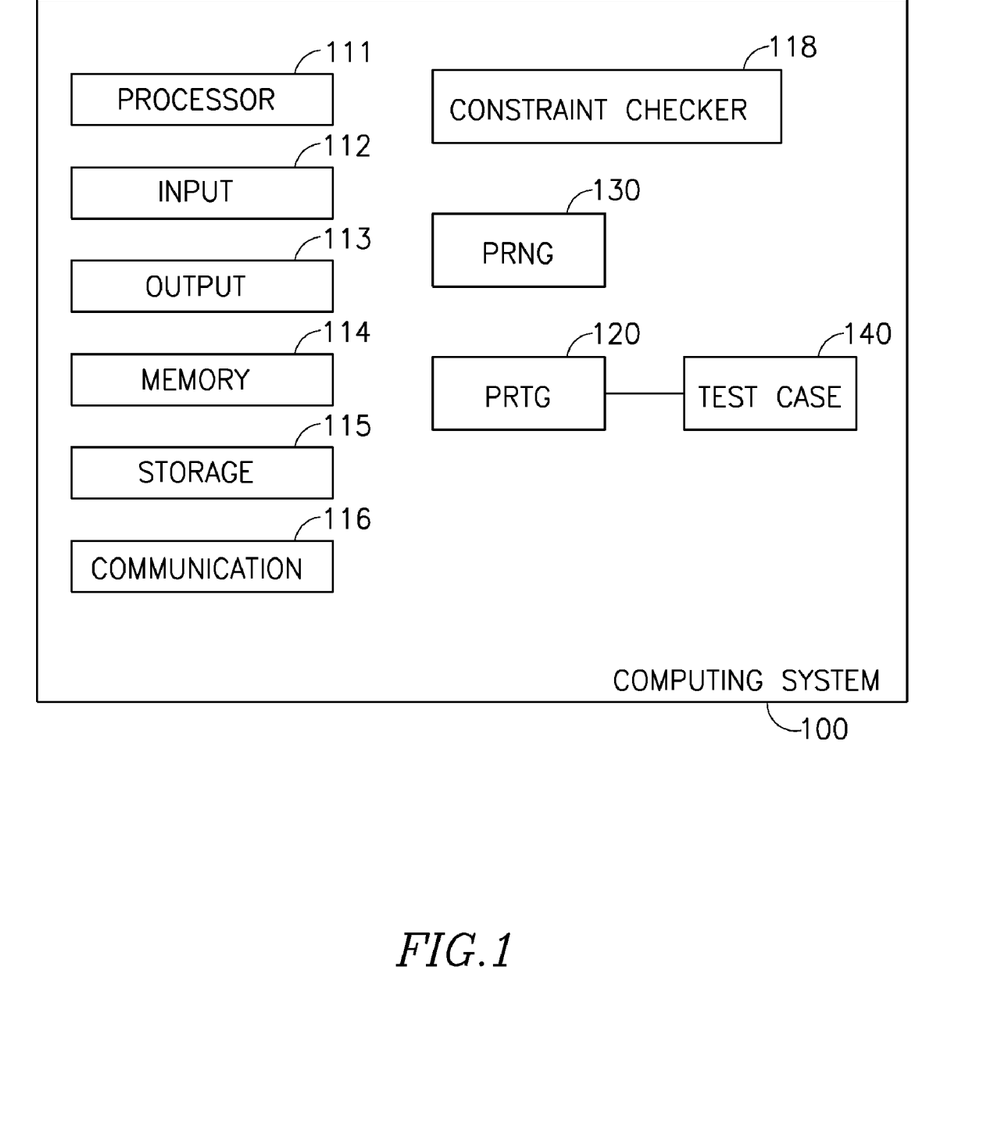
FIG. 1 is a schematic block diagram illustration of a computing system, in accordance with some demonstrative embodiments.

Reference is made to FIG. 1, which schematically illustrates a system 100 in accordance with some demonstrative embodiments. In some non-limiting embodiments, one or more elements of system 100 may have an N word-size to process a string of N binary bits as a single word. In other embodiments, one or more elements of system 100 may have any other suitable word size.

In some embodiments, system 100 may include a constraint checker 118 to determine whether or not to utilize a predefined mask constraint and a predefined range constraint by determining whether or not the range and mask constraints are satisfiable, e.g., as described in detail below.

In some embodiments, constraint checker 118 may be included in, associated with, or implemented as a part of a PRNG 130, and/or a PRTG 120, to check whether or not there exists at least one number satisfying the predefined range and/or mask constraints, for example, as part of a hardware verification process. In some embodiments, PRTG 120 may generate at least one test case 140 including values for instruction opcodes, satisfying a plurality of user defined and/or architecture defined constraints, which may be represented by one or more range and mask constraints, e.g., including the predefined range and mask constrains.

In some embodiments, constraint checker 118 may receive, e.g., from PRTG 120 or from PRNG 130, an input including a plurality of input constraints, for example, a range constraint and a mask constraint; and determine whether or not the input constraints are satisfiable. For example, constraint checker 118 may receive a range constraint specifying a range, e.g., defined by an upper bound, denoted max, and a lower bound, denoted min. Constraint checker 118 may also receive a mask constraint, for example, constraining one or more fixed bits of an N-bit string representing a number, to have specific values; while maintaining one or more other, variable bits of the number unconstrained. For example, a mask "XXX1XX0X" may constrain a second LSB and a fifth LSB of the number to have the values "0" and "1", respectively, and maintain values of a first, third, fourth, sixth, seventh and eighth LSBs of the number uncostrained, to be randomly selected.

In some embodiments, constraint checker 118 may determine whether or not the input constraints are satisfiable, e.g., by applying a predefined sequence of logical operations to strings representing the range constraint, e.g., a strings representing the upper bound of the range; and the mask constraint, e.g., strings representing the fixed bits and/or variable bits of the mask. The sequence of logical operations may be defined such that applying the sequence of logical operations to the strings representing the range and mask constraints may be logically equivalent to determining whether or not at least one number exists that satisfies the input constraints, e.g., as described in detail below.

In some embodiments, constraint checker 118 may determine a first number based on the range and mask constraints. For example, constraint checker 118 may determine the first number to be the highest number, which satisfies the variable bits of the mask constraint, and which is smaller than or equal to a number corresponding to a combination of the upper bound of the range and the fixed bits of the mask constraint, e.g., as described below. In one non-limiting example, constraint checker 118 may determine the first number by applying a predefined function, denoted closestBelow, to a string representing the variable bits of the mask constraint, and to a string corresponding to the upper bound of the range constraint, e.g., as described below with reference to FIG. 3. Constraint checker 118 may determine a second number, for example, based on the first number and on the mask constraint. For example, the second number may correspond to the sum of the first number and a number corresponding to the fixed bits of the mask constraint, e.g., as described below with reference to FIGS. 2 and/or 3.

In some embodiments, constraint checker 118 may determine whether or not the mask and range constraints are satisfiable by determining whether or not the second number satisfies the range constraint, e.g., as described below.

In some embodiments, constraint checker 118 may determine whether or not the mask and range constraints are satisfiable within a time period corresponding to a time complexity of no more than an order of log(N); and/or utilizing a memory space independent of the value of N, e.g., assuming system 100 utilizes an N word-size for processing N-bit strings.

In some embodiments, constraint checker 118 may determine whether or not the mask and range constraints are satisfiable, for example, prior to attempting to generate a pseudo random number based on the range and mask constraints, e.g., using PRNG 130.

In some embodiments, constraint checker 118 may determine whether or not a first range constraint and a first mask constraint, e.g., provided by a user and/or application of system 100, are satisfiable. The first range constraint and/or mask constraint may be modified, adjusted, changed, broadened, and/or replaced by a second range constraint and/or a second mask constraint, e.g., if it is determined that the first mask and range constraints are not satisfiable. Constraint checker 118 may determine whether or not the second range and mask constraints are satisfiable. The second range constraint and/or mask constraint may be modified, adjusted, changed, broadened, and/or replaced by a third range constraint and/or a third mask constraint, e.g., if it is determined that the second mask and range constraints are not satisfiable. The range and/or mask constraints may iteratively be modified, adjusted, changed, broadened, and/or replaced, e.g., until it is determined that the mask and range constraints are satisfiable ("the satisfiable mask and range constraints"). A pseudo random number may be generated, e.g., by PRNG 130, based on the satisfiable mask and range constraints without, for example, attempting to generate a number based on the mask and range constraints which were determined to be un-satisfiable. Accordingly, a number may be pseudo randomly generated within a relatively short time period, e.g., since only satisfiable mask and range constraints may be used for generating the number.

In some demonstrative embodiments, system 100 may include, for example, a processor 111, an input unit 112, an output unit 113, a memory unit 114, a storage unit 115, and/or communication unit 116. System 100 optionally includes other suitable hardware components and/or software components.

In some demonstrative embodiments, processor 111 includes, for example, a central processing unit (CPU), a digital signal processor (DSP), a microprocessor, a host processor, a controller, a plurality of processors or controllers, a chip, a microchip, one or more circuits, circuitry, a logic unit, an integrated circuit (IC), an application-specific IC (ASIC), or any other suitable multi-purpose or specific processor or controller.

In some demonstrative embodiments, input unit 112 includes, for example, a keyboard, a keypad, a mouse, a touch-pad, a stylus, a microphone, or other suitable pointing device or input device. Output unit 113 include, for example, a cathode ray tube (CRT) monitor or display unit, a liquid crystal display (LCD) monitor or display unit, a screen, a monitor, a speaker, or other suitable display unit or output device.

In some demonstrative embodiments, memory unit 114 includes, for example, a random access memory (RAM), a read only memory (ROM), a dynamic RAM (DRAM), a synchronous DRAM (SD-RAM), a flash memory, a volatile memory, a non-volatile memory, a cache memory, a buffer, a short term memory unit, a long term memory unit, or other suitable memory units or storage units. Storage unit 115 includes, for example, a hard disk drive, a floppy disk drive, a compact disk (CD) drive, a CD-ROM drive, a digital versatile disk (DVD) drive, or other suitable removable or non-removable storage units. Memory unit 114 and/or storage unit 115 may, for example, store data processed by system 100.

In some demonstrative embodiments, communication unit 116 includes, for example, a wired or wireless network interface card (NIC), a wired or wireless modem, a wired or wireless receiver and/or transmitter, a wired or wireless transmitter-receiver and/or transceiver, a radio frequency (RF) communication unit or transceiver, or other units able to transmit and/or receive signals, blocks, frames, transmission streams, packets, messages and/or data. Communication unit 116 may optionally include, or may optionally be associated with, for example, one or more antennas, e.g., a dipole antenna, a monopole antenna, an omni-directional antenna, an end fed antenna, a circularly polarized antenna, a microstrip antenna, a diversity antenna, or the like.

In some demonstrative embodiments, the components of system 100 are enclosed in, for example, a common housing, packaging, or the like, and are interconnected or operably associated using one or more wired or wireless links. In other embodiments, for example, components of system 100 may be distributed among multiple or separate devices, may be implemented using a client/server configuration or system, may communicate using remote access methods, or the like.

Figure 2:
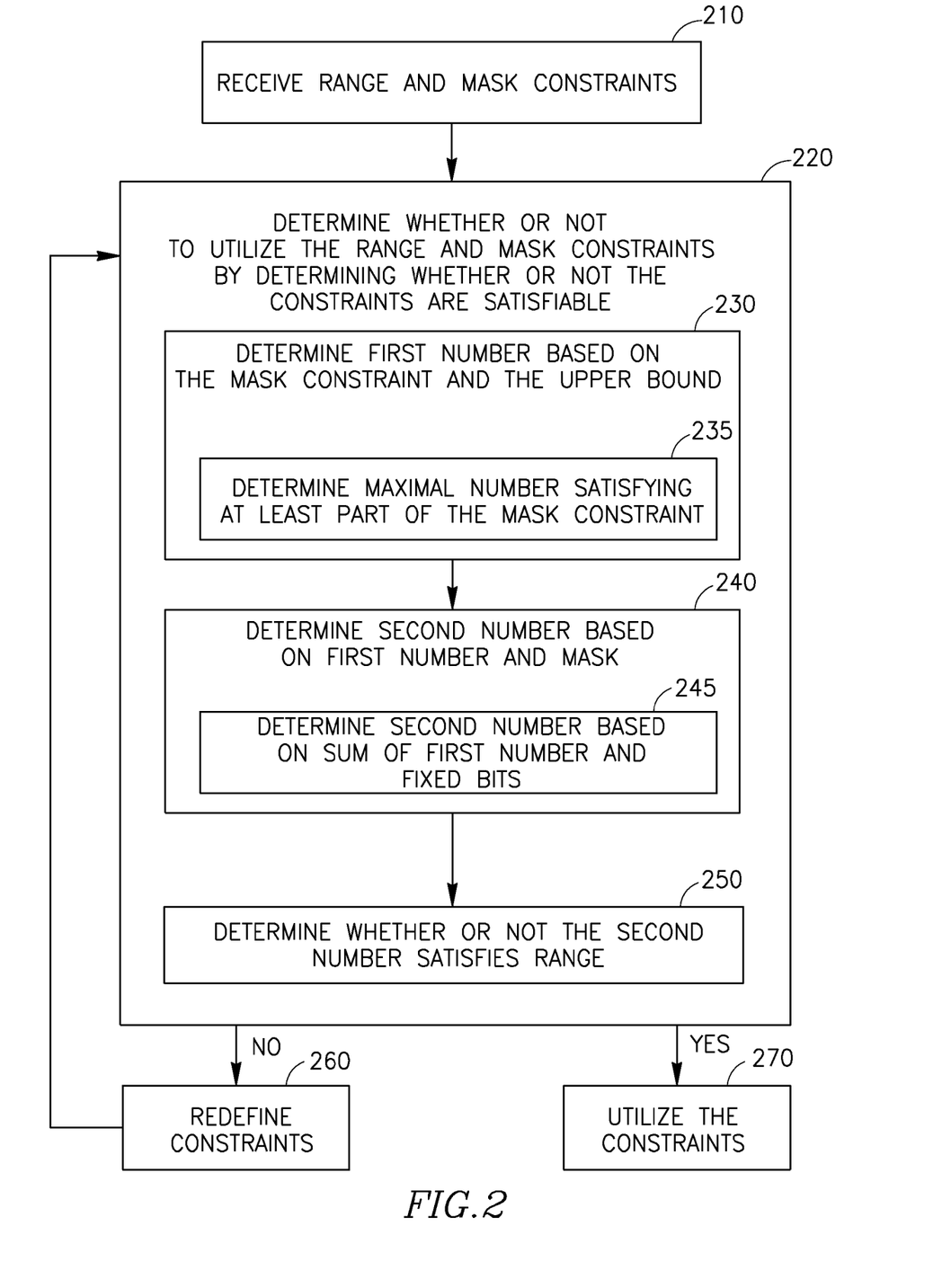
FIG. 2 is a schematic flow-chart illustration of a method of handling mask and range constraints, in accordance with some demonstrative embodiments.

Reference is made to FIG. 2, which schematically illustrates a method of handling mask and range constraints, in accordance with some demonstrative embodiments. In some non-limiting embodiments, one or more operations of the method of FIG. 2 may be implemented, for example, by one or more elements of a system, e.g., system 100 (FIG. 1), for example, a constraint checker, e.g., constraint checker 118 (FIG. 1), and/or by other suitable units, devices and/or systems, to determine whether or not to utilize a predefined range constraint and a predefined mask constraint, e.g., by determining whether or not the mask and range constraints are satisfiable.

As indicated at block 210, in some embodiments the method may include receiving the predefined range and mask constraints. The range and mask constraints may be predefined by a user, an application and/or by other requirements, for example, requirements associated with hardware-verification, e.g., as described above.

As indicated at block 220, in some embodiments the method may include determining whether or not to utilize the range and mask constraints, for example, by determining whether or not the range and mask constraints are satisfiable. Determining whether or not the range and mask constraints are satisfiable may include, for example, determining whether or not the range and mask constraints are satisfiable by applying a predefined sequence of logical operations to the range and mask constraints, e.g., as described below.

As indicated at block 230, in some embodiments determining whether or not the range and mask constraints are satisfiable may include, for example, determining a first number, denoted x, based the mask constraint M and on the upper bound max of the range constraint, e.g., as described below.

In some embodiments, the mask M may be characterized, or represented by an ordered pair of binary strings of N bits, denoted (fixedBits, variableBits). The string fixedBits may represent constrained bits of the mask M; and the string variableBits may represent unconstrained bits of the mask M. The string fixedBits may include, or may be, for example, a binary string of N bits having bits with the value "1" representing respective bits of the mask M having a constrained value "1"; and having bits with the value "0" for substantially all other bits. The string variableBits may include, or may be, for example, a binary string of N bits having bits with the value "1" representing respective unconstrained bits of the mask M, and having bits with the value "0" for substantially all other bits. For example, the mask M=XX1X01XX0 may be represented by a corresponding ordered pair of strings (fixedBits, variableBits), wherein fixedBits=00100000, and variableBits=110100110.

As indicated at block 235, determining the number x based the mask constraint M and the upper bound max may include determining the number x to be the maximal number, which is smaller than or equal to a number corresponding to a combination of the upper bound of the range and the fixed bits of the mask constraint, e.g., the number max-fixedBits, and which satisfies at least part of the mask constraint, e.g., which satisfies a constraint represented by the string variableBits. For example, determining the number x may include applying the function closestBelow, to the values variableBits, and (max-fixedBits), e.g., as described below with reference to FIG. 3.

As indicated at block 240, in some embodiments determining whether or not the range and mask constraints are satisfiable may include determining a second number, denoted y, based on the number x and the mask M, e.g., as described below.

As indicated at block 245, determining the number y based on the number x and the mask M may include, for example, determining the number y based on a sum of the number x and a number, denoted fBn, corresponding to the string fixedBits.

As a demonstrative non-limiting example, the number y may be equal to the sum of the number x and the number fBn.

As indicated at block 250, in some embodiments, determining whether or not the range and mask constraints are satisfiable may include determining whether or not the number y satisfies the range constraint.

In some embodiments, determining whether or not the mask and range constraints are satisfiable, e.g., as described above with reference to block 220, may include applying a pre-defined function, denoted is Satisfiable, to the values fixedBits, variableBits, min, and max, to generate an output which is either "true", e.g., if the mask and range constraints are satisfiable; or "false", e.g., if the mask and range constraints are not satisfiable.

In some embodiments, one or more operations of the method of FIG. 2 may be implemented using any suitable computer readable program including a computer code, for example, written in a "C" computer language or any other suitable language. For example, one or more operations of FIG. 2 may be implemented using one or more lines of the following code:

```
027  int isSatisfiable(unsigned fixedBits,unsigned variableBits,
028  int min,int max)
029  {
030       int x=closestBelow(variableBits,max-fixedBits);
031       int y=x+fixedBits;
032       return (y>=min && y<=max);
033  }
```

As indicated at block 270, the method may include utilizing the mask and range constraints, e.g., if it is determined that the range and mask constraints are satisfiable. In one non-limiting example, the method may include utilizing the range and mask constraints as part of a pseudo random-number-generation process only if it is determined that the mask and range constraints are satisfiable.

As indicated at block 260, in some non-limiting embodiments, the method may also include redefining the mask and/or range constraints, e.g., if it is determined that the mask and range constraints are not satisfiable. In one example, the mask and/or range constraints may be redefined prior to attempting to generate a pseudo random number satisfying the range and mask constraints, e.g., as described above. For example, the method may include iteratively re-defining the mask and/or range constraints, e.g., by broadening the range and/or mask constraints; and checking whether or not the range and defined mask constraints are satisfiable, e.g., until a pair of range and mask constraints are determined to be satisfiable. For example, constraint checker 118 (FIG. 1) may iteratively be provided with range and mask constraints, e.g., until a pair of range and mask constraints are determined to be satisfiable; and PRNG 130 (FIG. 1) may be used to generate a pseudo random number based on the pair of range and mask constraints determined to be satisfiable.

Figure 3:
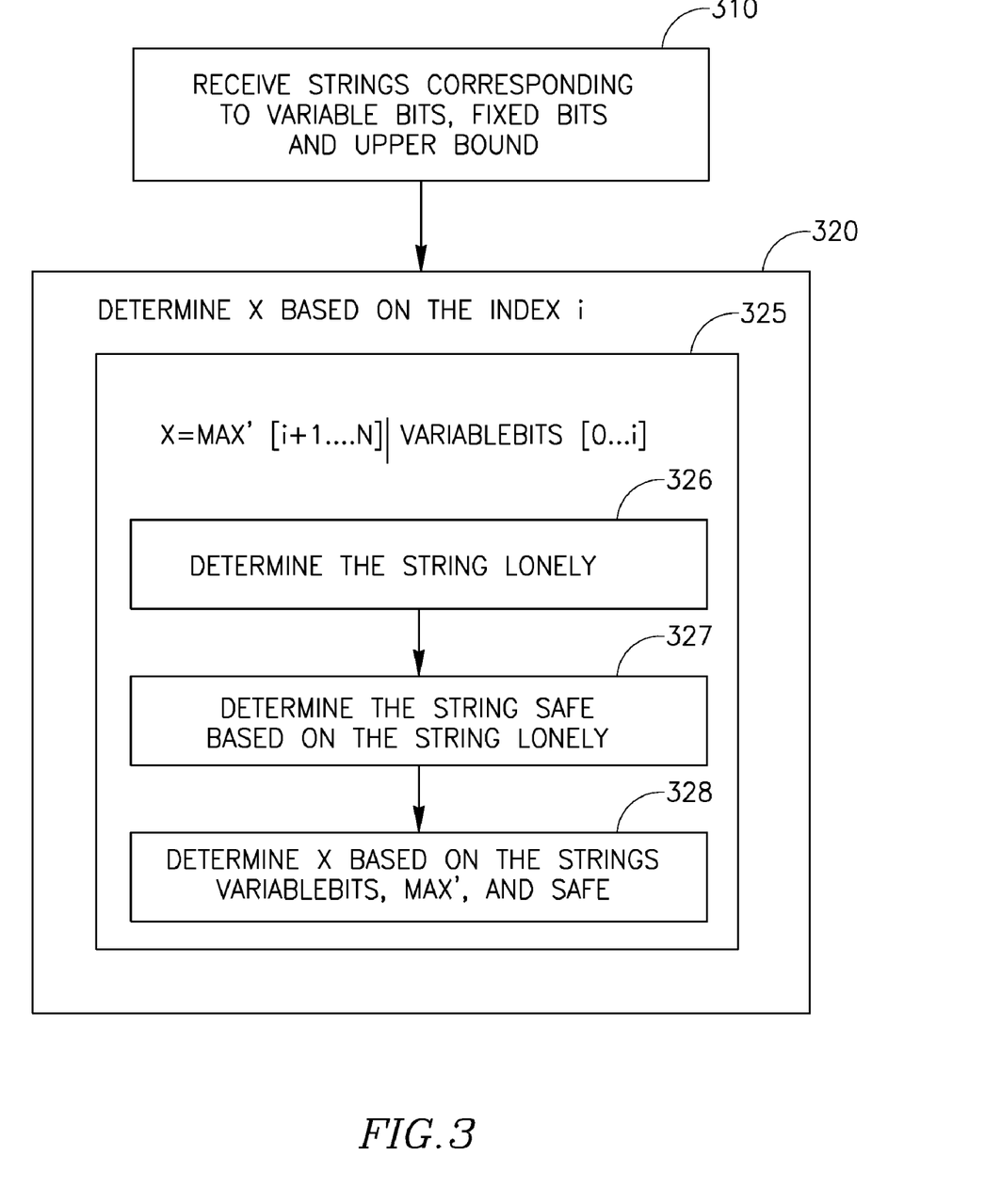
FIG. 3 is a schematic flow-chart illustration of a method of determining a number based on a mask constraint and an upper bound of a range constraint, in accordance with demonstrative embodiments.

Reference is made to FIG. 3, which schematically illustrates a method of determining a number based on a mask constraint and an upper bound of a range constraint, in accordance with some demonstrative embodiments. In some non-limiting embodiments, one or more operations of the method of FIG. 3 may be included in, or implemented by, for example, one or more operations of a method of checking mask and range constraints, e.g., the method of FIG. 2; and/or one or more elements of a system, e.g., system 100 (FIG. 1), for example, a constraint checker, e.g., constraint checker 118 (FIG. 1), and/or by other suitable methods, units, devices and/or systems. In one example, one or more operations of the method of FIG. 3 may be implemented by a constraint checker, e.g., constraint checker 118 (FIG. 1), to determine the number x, e.g., as described above with reference to block 230 of FIG. 2, based on the upper bound max, and the strings fixedBits and variableBits.

As indicated at block 310, in some embodiments the method may include receiving first and second N-bit strings corresponding to the variable bits of the mask constraint, and the upper bound max of the range constraint ("the string max"), respectively. In one example, the first string may include the string variableBits, and the second string may include the string max'=(max-fixedBits), e.g., as described below. The strings max, variableBits, and/or fixedBits may correspond to mask and range constraints predefined by a user, application and/or by other requirements, e.g., as described above.

As indicated at block 320, in some embodiments, the method may include determining the number x based on a highest bit index, denoted i, of the string max' having a value "1" that has the same index as a bit of the string variableBits having a value "0". As a demonstrative non-limiting example, if max'=0001000110 and variableBits=0010011110, then i=7 [Udi: is this correct?]. The index i may be defined to be equal to 0, if there does not exist a bit of the string max' having a value "1" that has the same index as a bit of the string variableBits having a value "0".

As indicated at block 325, in some embodiments determining the number x based on the index i may include determining the string x according to the string max'[i+1 . . . N] and the string variableBits[0 . . . i]. For example, the string x may be determined to satisfy the following condition:

$$x = max'[i+1 \ldots N] | variableBits[0 \ldots i] \quad (1)$$

wherein str[q.w] denotes a string having a value "0" in bits having indices greater than w or smaller than q, and values equal to values of respective bits of a string denoted str in substantially all other bits. For example, if str=-1011001011, then str[3.8]=0011001000; and wherein "|" denotes a bitwise "or" logical operator.

In some embodiments, the string x according to Equation 1 may represent a maximal number, which is smaller than or equal to max', and which satisfies the string variableBits, as described below.

As indicated at block 326, in some embodiments determining the number x based on the index i may include determining a first string, denoted lonely, wherein the most-significant non-zero bit of the string lonely has the index i. For example, the string lonely may be determined by applying the following bitwise logical function to the strings max and variableBits:

$$lonely = max' \& \sim variableBits \quad (2)$$

wherein "&" denotes a bitwise "and" logical operator; and "~" denotes a bitwise "not" logical operator.

For example, a bit of the string lonely may have a value "1" if and only if a respective bit of the string max' has a value "1" and a respective bit of the string variableBits has a value "0". Therefore, for example, if the index i is equal to 0, then the string lonely is equal to the string "0".

As indicated at block 327, in some embodiments determining the number x based on the index i may include determining a second string, denoted safe, such that safe(j)=1 for any j<=i. For example, the string safe may represent the number safe=$2^i$-1.

In some embodiments, determining the string safe may include applying a predefined function, denoted smear, to the string lonely. The function smear may generate the string safe, for example, by generating a string having the values "1" in all bits having indices smaller or equal to the index i of the most-significant non-zero bit of the string lonely, and having values "0" in all other bits.

In some embodiments, one or more operations of the function smear may be implemented using any suitable computer readable program including a computer code, for example, written in a "C" computer language or any other suitable language. For example, one or more operations of the function smear may be implemented using one or more lines of the following code with relation to an input string, denoted z:

```
010  int smear(int z)
011  {
012      z|=z>>1;
013      z|=z>>2;
014      z|=z>>4;
015      z|=z>>8;
016      z|=z>>16;
017      return z;
018  }
```

As a demonstrative non-limiting example, if z=10010, then the function smear may return the string 111111, e.g., by applying the following procedure to the string z:

z|=1001 resulting with 11001
z|=110 resulting with 11110
z|=1 resulting with 11111

As indicated at block 328, in some embodiments determining the number x based on the index i may include determining the number x based on the strings variableBits, max', and safe, e.g., as follows:

$$x = \text{variableBits} \& (\text{max'}|\text{safe}) \qquad (3)$$

In some embodiments, determining the string x according to Equation 3 may be logically equivalent to satisfying Equation 1, e.g., as described in detail below.

If i=0 then the string lonely may receive the value 0; and the string safe may receive the value 0, e.g., since the function smear may return the string 0 when applied to the string lonely=0. Accordingly, the bitwise logical operation max'|safe may return the string max', and the logical operation variableBits&(max'|safe) may return the string max', e.g., since a bit of the string variableBits has a value "0" only if a respective bit of max' has a value "0". Therefore, the string x=max' resulting from Equation 3 when i=0 may be equal to the highest number which is smaller than or equal to the string max', and which satisfies the string variableBits, e.g., since the string max' satisfies the string variableBits due to the logical condition "&variableBits" of Equation 3. Additionally, if i=0, then the string max[i+1 . . . N] is equal to the string max'[1 . . . N]=max'. Therefore the string x according to Equation 3 satisfies the condition of Equation 1.

Otherwise, e.g., if i≠0, as described above with reference to blocks 326 and 327, for k>i, if max'(k)=1 then variableBits (k)=1, e.g., according to the definition of i; and for k<=i, safe(k)=1, e.g., by the definition of the string safe. Accordingly, the bitwise logical operation max'|safe may return a string in which every bit that has an index smaller than or equal to the index i has a value "1", and substantially every other bit has a value equal to the value of a respective bit of max'. Therefore, if x is determined according to Equation 3, then bits of the string x having indices greater than the index i may have values equal to values of respective bits of the string max', e.g., x[i+1 . . . N]=max'[i+1 . . . N]; and bits of the string x having indices equal to or smaller than the index i may have values equal to values of respective bits of the string variableBits, e.g., x[1 . . . i]=variableBits[1 . . . i].

Therefore, determining the string x according to Equation 3 may be logically equivalent to satisfying Equation 1.

In some embodiments, it may be proven that the number x according to Equations 1 and/or 3 may represent a maximal number, which is smaller than or equal to max', and which satisfies the string variableBits, e.g., as described in detail below.

The string x satisfies the string variableBits, since as described above, the string x is logically equivalent to variableBits&(max'|safe).

Additionally, the number x as represented in Equation 1 is smaller than the upper bound max', since the strings max' and x coincide for bits having indices greater than i, e.g., x[i+1 . . . N]=max[i+1 . . . N]; while the i-th bit of the string x receives a value "0", e.g., x(i)=0; whereas the i-th bit of the string max' receives a value "1", e.g., max'(i)=1, by the definition of i.

Additionally, the number x is the maximal number satisfying the string variableBits since, as proven below a number, denoted s, which satisfies the string variableBits and is equal to or smaller than the string max' must be smaller than or equal to the number x.

For example, if for all values of an index l, s(l)<=x(l), then s<=x. Otherwise, an index k may represent the highest index such that s(k)>x(k). The index k may be greater than i, since if k<=i, then s(k)>variableBits(k), which is in contradiction to the assumption that s satisfies the mask constraint. However, if k>i, then s(k)>max'(k), which may require that there must be an index n>k such that s(n)<max'(n), which in turn may imply that s(n)<x(n). Therefore, the number s must be smaller than the number x, since for all n'>k, s(n')<=x(n').

One or more operations of the method of FIG. 3 may be implemented using any suitable computer readable program including a computer code, for example, written in a "C" computer language or any other suitable language. For example, one or more operations of the method of FIG. 3 may be implemented using one or more lines of the following code:

```
020  int closestBelow(unsigned variableBits,int max')
021  {
022      unsigned lonely=max'&~variableBits;
023      unsigned safe=smear(lonely);
024      return (variableBits&(max'|safe));
025  }
```

In some embodiments, determining whether or not the number y satisfies the range constraint, e.g., as described above with reference to FIG. 2, may be logically equivalent to determining whether or not the mask and range constraints are satisfiable.

It may be proven that if the number y satisfies the range constraint, then the mask and range constraints are satisfiable. For example, the string x may satisfy the mask (0, variableBits), e.g., since x is determined according to Equation 3. Therefore, the string y may satisfy the mask M=(fixedBits, variableBits), since fixedBits & variableBits=0. Therefore, if the number y satisfies the range constraint, it may follow that the number y satisfies both the range and mask constraints. Accordingly, the mask and range constraints are satisfiable, if the number y satisfies the range constraint.

It may also be proven that if the range and mask constraints are satisfiable, then the number y will satisfy the range constraint. For example, if:

$$z'=z\text{-fixedBits} \quad (4)$$

wherein z denotes a highest number such that z satisfies the mask and range constraints, e.g., min<=z<=max, then:

$$z'<=\text{max-fixedBits} \quad (5)$$

In addition, the number z' may be the highest number satisfying the range and the mask (0, variableBits), e.g., by the definition of the number z' and since the number z is the highest number satisfying the mask M and the range. Therefore:

$$x=z' \quad (6)$$

and:

$$y=z \quad (7)$$

Accordingly, if the range and mask constraints are satisfiable, then the number y will satisfy the range constraint.

Some embodiments of the invention, for example, may take the form of an entirely hardware embodiment, an entirely software embodiment, or an embodiment including both hardware and software elements. Some embodiments may be implemented in software, which includes but is not limited to firmware, resident software, microcode, or the like.

Furthermore, some embodiments of the invention may take the form of a computer program product accessible from a computer-usable or computer-readable medium providing program code for use by or in connection with a computer or any instruction execution system. For example, a computer-usable or computer-readable medium may be or may include any apparatus that can contain, store, communicate, propagate, or transport the program for use by or in connection with the instruction execution system, apparatus, or device.

In some embodiments, a data processing system suitable for storing and/or executing program code may include at least one processor coupled directly or indirectly to memory elements, for example, through a system bus. The memory elements may include, for example, local memory employed during actual execution of the program code, bulk storage, and cache memories which may provide temporary storage of at least some program code in order to reduce the number of times code must be retrieved from bulk storage during execution.

Functions, operations, components and/or features described herein with reference to one or more embodiments, may be combined with, or may be utilized in combination with, one or more other functions, operations, components and/or features described herein with reference to one or more other embodiments, or vice versa.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A computer-implemented method of handling range and mask constraints, the method performed by a processor including a memory device, the method comprising:

determining by the processor whether or not to utilize a mask numeric constraint and a range numeric constraint, by determining whether or not the range and mask numeric constraints are satisfiable by at least one number, said determining comprising:

determining a first number based on the range and mask numeric constraints;

determining a second number based on the first number and on the mask numeric constraint; and determining whether or not the range and mask numeric constraints are satisfiable by determining whether or not said second number satisfies said range numeric constraint.

2. The method of claim 1, wherein determining whether or not the range and mask constraints are satisfiable comprises determining whether or not at least one number satisfies the both the range and mask constraints.

3. The method of claim 1, wherein determining said second number comprises determining said second number based on a sum of the first number and a number corresponding to a fixed-bit component of the mask constraint.

4. The method of claim 1 comprising utilizing said range and mask constraints as part of a pseudo random-number-generation process only if it is determined that said mask and range constraints are satisfiable.

5. The method of claim 1 comprising modifying at least one of said mask and range constraints if it is determined that said mask and range constraints are not satisfiable.

6. The method of claim 1, wherein at least one of said mask and range constraints comprises an N bit string, the method comprising determining within a time complexity of no more than an order of log(N), whether or not the range and mask constraints are satisfiable.

7. The method of claim 1, wherein determining said first number comprises determining a highest number which is smaller than or equal to a number corresponding to a combination of an upper bound of the range and a fixed-bit component of the mask constraint, and which satisfies a variable-bit component of the mask constraint.

8. The method of claim 7, wherein determining said first number comprises determining said first number based on a bit index of a most significant non-zero bit of a string corresponding to a subtraction of said fixed-bit component from said upper bound; and wherein a bit having said index of a string corresponding to said variable-bit component has a zero value.

9. The method of claim 8, wherein determining said first number comprises:

determining a first string based on said upper bound and said mask constraint;

determining a second string representing a number corresponding to an index of a most significant non-zero bit of said first string; and determining said first number based on said upper bound, said mask constraint and said second string.

10. A system capable of utilizing range and mask numeric constraints, the system comprising:

a constraint checker to determine whether or not to utilize a mask numeric constraint and a range numeric constraint by determining whether or not the range and mask numeric constraints are satisfiable by at least one number, wherein said constraint checker is capable of:

determining a first number based on the range and mask numeric constraints;

determining a second number based on the first number and on the mask numeric constraint; and determining whether or not the range and mask numeric constraints are satisfiable by determining whether or not said second number satisfies said range numeric constraint.

11. The system of claim 10, wherein said constraint checker is capable of determining whether or not the range and mask constraints are satisfiable by determining whether or not at least one number satisfies the both the range and mask constraints.

12. The system of claim 10, wherein said constraint checker is capable of determining said second number based on a sum of the first number and a number corresponding to a fixed-bit component of the mask constraint.

13. The system of claim 10 comprising a pseudo random number generator to utilize said range and mask constraints as part of a pseudo random-number-generation process only if it is determined that said mask and range constraints are satisfiable.

14. The system of claim 10, wherein said constraint checker is capable of determining said first number by determining a highest number which is smaller than or equal to a number corresponding to a combination of an upper bound of the range and a fixed-bit component of the mask constrain, and which satisfies a variable-bit component of the mask constraint.

15. The system of claim 14, wherein said constraint checker is capable of determining said first number based on a bit index of a most significant non-zero bit of a string corresponding to a subtraction of said fixed-bit component from said upper bound; and wherein a bit having said index of a string corresponding to said variable-bit component has a zero value.

16. A computer program product comprising a computer readable storage medium including a computer-readable program, wherein the computer-readable program when executed on a computer causes the computer to:

determine whether or not to utilize a mask numeric constraint and a range numeric constraint by determining whether or not the range and mask numeric constraints are satisfiable by at least one number, comprising the steps of:

determining by a computerized device whether or not to utilize a mask numeric constraint and a range numeric constraint, by determining whether or not the range and mask numeric constraints are satisfiable, said determining comprising:

determining a first number based on the range and mask numeric constraints;

determining a second number based on the first number and on the mask numeric constraint; and determining whether or not the range and mask numeric constraints are satisfiable by determining whether or not said second number satisfies said range numeric constraint.

17. The computer program product of claim 16, wherein the computer-readable program when executed on the computer causes the computer to determining whether or not at least one number satisfies the both the range and mask constraints.

* * * * *